(12) United States Patent
Doris et al.

(10) Patent No.: US 10,032,680 B2
(45) Date of Patent: Jul. 24, 2018

(54) STRAINED FINFET DEVICE FABRICATION

(71) Applicant: International Business Machines Corporation, Armonk, NY (US)

(72) Inventors: Bruce B. Doris, Slingerlands, NY (US); Hong He, Schenectady, NY (US); Sivananda K. Kanakasabapathy, Niskayuna, NY (US); Gauri Karve, Cohoes, NY (US); Fee Li Lie, Albany, NY (US); Stuart A. Sieg, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/984,215

(22) Filed: Dec. 30, 2015

(65) Prior Publication Data

US 2017/0054024 A1    Feb. 23, 2017

Related U.S. Application Data

(60) Division of application No. 14/833,363, filed on Aug. 24, 2015, which is a continuation of application No. 14/830,969, filed on Aug. 20, 2015.

(51) Int. Cl.
*H01L 29/78* (2006.01)
*H01L 21/84* (2006.01)
(Continued)

(52) U.S. Cl.
CPC ...... *H01L 21/845* (2013.01); *H01L 21/02532* (2013.01); *H01L 21/02592* (2013.01);
(Continued)

(58) Field of Classification Search
CPC .......... H01L 27/0886; H01L 29/66795; H01L 29/66803; H01L 29/6681; H01L 29/66818;
(Continued)

(56) References Cited

U.S. PATENT DOCUMENTS

2007/0001232 A1* 1/2007 King ............... H01L 21/84
                                                257/368
2008/0265308 A1* 10/2008 Lee ............... H01L 21/28282
                                                257/324
(Continued)

OTHER PUBLICATIONS

Definition of Segment from Merriam Webster website, http://www.merriam-webster.com/dictionary/segment (2016).*
(Continued)

*Primary Examiner* — Michele Fan
(74) *Attorney, Agent, or Firm* — Cantor Colburn LLP; Vazken Alexanian

(57) ABSTRACT

A method for forming a fin on a substrate comprises patterning and etching a layer of a first semiconductor material to define a strained fin, depositing a layer of a second semiconductor material over the fin, the second semiconductor material operative to maintain the a strain in the strained fin, etching to remove a portion of the second semiconductor material to define a cavity that exposes a portion of the fin, etching to remove the exposed portion of the fin such that the fin is divided into a first segment and a second segment, and depositing an insulator material in the cavity, the insulator material contacting the first segment of the fin and the second segment of the fin.

14 Claims, 25 Drawing Sheets

(51) Int. Cl.
*H01L 27/12* (2006.01)
*H01L 27/088* (2006.01)
*H01L 29/66* (2006.01)
*H01L 21/02* (2006.01)
*H01L 21/265* (2006.01)
*H01L 21/306* (2006.01)
*H01L 21/762* (2006.01)
*H01L 29/06* (2006.01)
*H01L 29/16* (2006.01)
*H01L 29/161* (2006.01)
*H01L 29/165* (2006.01)

(52) U.S. Cl.
CPC .. *H01L 21/26506* (2013.01); *H01L 21/30604* (2013.01); *H01L 21/76213* (2013.01); *H01L 27/0886* (2013.01); *H01L 27/1211* (2013.01); *H01L 29/0653* (2013.01); *H01L 29/16* (2013.01); *H01L 29/161* (2013.01); *H01L 29/165* (2013.01); *H01L 29/6653* (2013.01); *H01L 29/66545* (2013.01); *H01L 29/66795* (2013.01); *H01L 29/785* (2013.01); *H01L 29/7846* (2013.01); *H01L 29/7848* (2013.01); *H01L 29/7851* (2013.01)

(58) Field of Classification Search
CPC ............... H01L 29/785; H01L 29/7851; H01L 29/7853; H01L 29/7854; H01L 29/7855; H01L 29/7856; H01L 2029/7857; H01L 2029/7858; H01L 21/823431
See application file for complete search history.

(56) References Cited

U.S. PATENT DOCUMENTS

| | | | | |
|---|---|---|---|---|
| 2010/0163971 | A1* | 7/2010 | Hung | H01L 29/66795 257/327 |
| 2013/0161694 | A1* | 6/2013 | Adam | H01L 21/823807 257/192 |
| 2013/0277748 | A1* | 10/2013 | Lee | H01L 29/785 257/368 |
| 2014/0001572 | A1* | 1/2014 | Bohr | H01L 21/823821 257/401 |
| 2014/0103453 | A1* | 4/2014 | Mor | H01L 29/785 257/401 |
| 2015/0255548 | A1* | 9/2015 | Holland | H01L 21/76 438/429 |
| 2016/0155739 | A1* | 6/2016 | Ting | H01L 29/0653 257/401 |

OTHER PUBLICATIONS

Bruce B. Doris, et al., "Strained FinFET Device Fabrication" U.S. Appl. No. 14/833,350, filed Aug. 24, 2015.
Bruce B. Doris, et al., "Strained FinFET Device Fabrication" U.S. Appl. No. 14/830,969, filed Aug. 20, 2015.
Bruce B. Doris, et al., "Strained FinFET Device Fabrication" U.S. Appl. No: 14/833,356, filed Aug. 24, 2015.
Bruce B. Doris, et al., "Strained FinFET Device Fabrication" U.S. Appl. No: 14/833,363, filed Aug. 24, 2015.
List of IBM Patents or Patent Applications Treated as Related; YOR920150469US5, filed Dec. 30, 2015, p. 1-2.

* cited by examiner

STRAINED FINFET DEVICE FABRICATION

PRIORITY

This application is a divisional application of U.S. patent application Ser. No. 14/833,363, filed Aug. 24, 2015, entitled "STRAINED FINFET DEVICE FABRICATION," which is a continuation application of U.S. patent application Ser. No. 14/830,969, filed on Aug. 20, 2015, entitled "STRAINED FINFET DEVICE FABRICATION," the entire contents of which are incorporated herein by reference.

BACKGROUND

The present invention relates to field effect transistor (FET) devices, and more specifically, to finFET devices. FinFET devices are FETs that have multiple gates arranged on a fin. The fin includes a channel region defined by the gate stack and active source and drain regions adjacent to the gate stack.

The performance of FET devices can often be improved by fabricating the devices such that strain is applied to the channel region or active regions of the devices. Previous finFET fins were often fabricated from silicon. Silicon germanium (SiGe) is now being used to fabricate fins for finFET devices.

SUMMARY

According to an embodiment of the present invention, a method for forming a fin on a substrate comprises patterning and etching a layer of a first semiconductor material to define a strained fin, depositing a layer of a second semiconductor material over the fin, the second semiconductor material operative to maintain the a strain in the strained fin, etching to remove a portion of the second semiconductor material to define a cavity that exposes a portion of the fin, etching to remove the exposed portion of the fin such that the fin is divided into a first segment and a second segment, and depositing an insulator material in the cavity, the insulator material contacting the first segment of the fin and the second segment of the fin.

According to another embodiment of the present invention, a method for fabricating a field effect transistor device comprises patterning and etching a layer of a first semiconductor material to define a fin, depositing a layer of a second semiconductor material over the fin, etching to remove a portion of the second semiconductor material to define a cavity that exposes a portion of the fin, etching to remove the exposed portion of the fin such that the fin is divided into a first segment and a second segment, depositing an insulator material in the cavity, the insulator material contacting the first segment of the fin and the second segment of the fin, etching to remove a portion of the second semiconductor material to define a dummy gate stack over the first segment of the fin that partially defines a channel region on the fin, forming spacers adjacent to the dummy gate stack, forming active regions in the first segment of the fin, growing an insulator material over exposed portions of the fin, removing the dummy gate stack, and forming a gate stack on the channel region of the fin.

According to yet another embodiment of the present invention, a method for forming a fin on a substrate comprises patterning and etching a layer of a first semiconductor material to define a fin, depositing a layer of a second semiconductor material over the fin, etching to remove a portion of the second semiconductor material to define a cavity that exposes a portion of the fin, etching to remove the exposed portion of the fin such that the fin is divided into a first segment and a second segment, depositing a layer of nitride material in the cavity the nitride material contacting the first segment of the fin and the second segment of the fin, and depositing an insulator material in the cavity, the insulator material contacting the layer of nitride material.

According to yet another embodiment of the present invention, a method for fabricating a fin comprises patterning and etching a layer of a first semiconductor material to define a fin, depositing a layer of a second semiconductor material over the fin, etching to remove a portion of the second semiconductor material to define a cavity that exposes a portion of the fin, depositing a spacer material along sidewalls of the cavity, and oxidizing the exposed portion of the fin such that the fin includes a first semiconductor material segment, a second semiconductor material segment and an oxidized material portion disposed between the first semiconductor material segment and the second semiconductor material segment.

According to yet another embodiment of the present invention, a field effect transistor device comprises a first semiconductor fin having a first distal end and a second distal end arranged on a substrate, a second semiconductor fin having a first distal end and a second distal end arranged on the substrate, the second semiconductor fin and the first semiconductor fin having a common longitudinal axis, an insulator material disposed between and in contact with the first distal end of the first semiconductor fin and the first distal end of the second semiconductor fin such that the insulator material exerts a tensile force on the first distal end of the first semiconductor fin and the first distal end of the second semiconductor fin, and a first gate stack arranged over the first semiconductor fin.

According to yet another embodiment of the present invention, a field effect transistor device comprises a first semiconductor fin having a first distal end and a second distal end arranged on a substrate, a second semiconductor fin having a first distal end and a second distal end arranged on the substrate, the second semiconductor fin and the first semiconductor fin having a common longitudinal axis, an insulator material disposed between and in contact with the first distal end of the first semiconductor fin and the first distal end of the second semiconductor fin such that the first distal end of the first semiconductor fin and the first distal end of the second semiconductor fin exert a compressive force on the insulator material, and a first gate stack arranged over the first semiconductor fin.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The embodiments described below offer a method for fabricating fins for a finFET device that are strained. The exemplary fins may be fabricated from any suitable semiconductor material such as, for example, silicon (Si) or silicon germanium (SiGe). The properties of SiGe are different from silicon and previous methods for inducing strain in silicon fins may not be as effective when retaining strain on SiGe fins.

Figure 1:
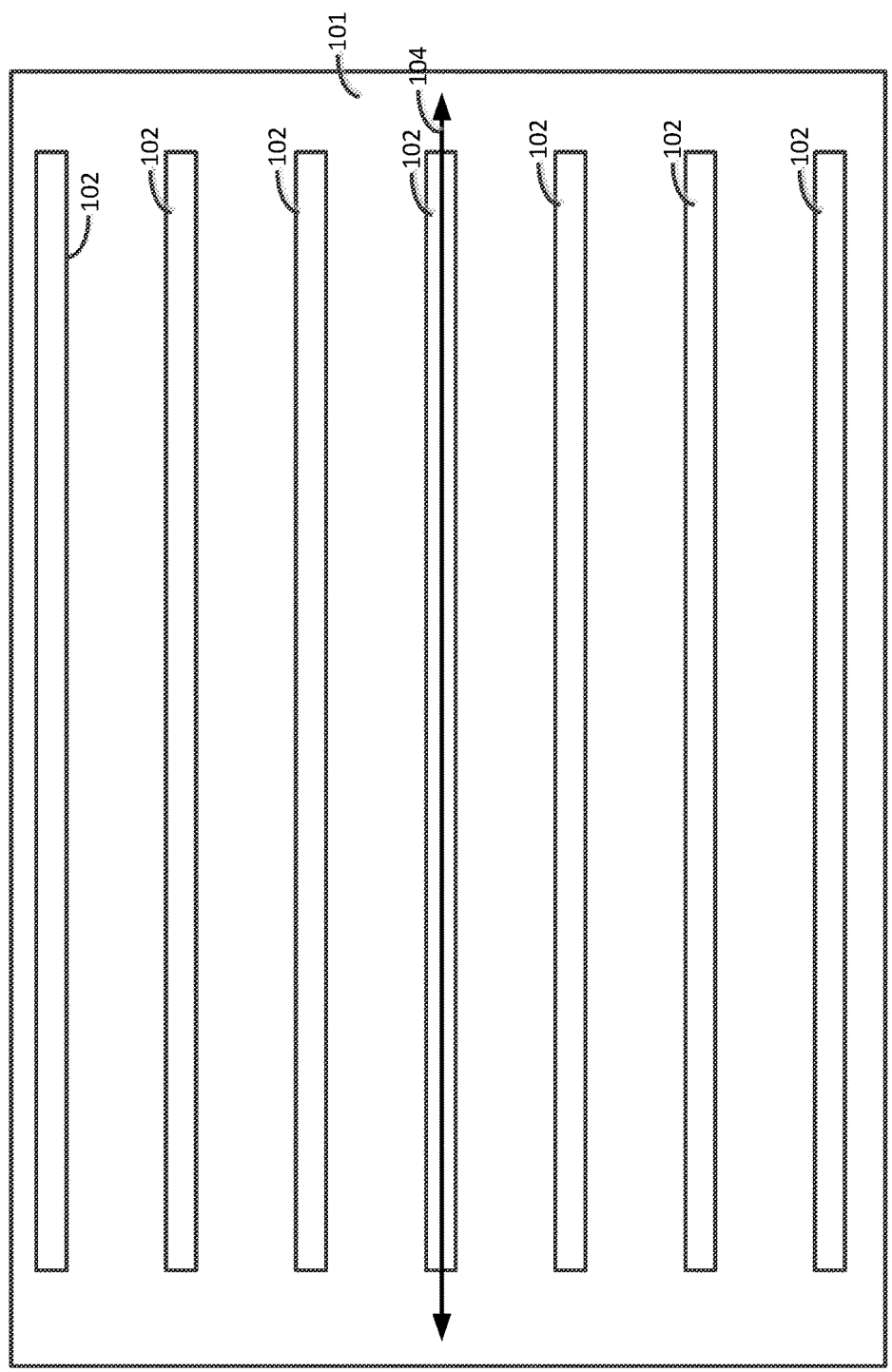
FIG. 1 illustrates an example of an arrangement of fins on a substrate.

FIG. 1 illustrates an example of an arrangement of fins 102 on a substrate 101. The substrate 101 may include, a bulk silicon substrate, a silicon on insulator substrate or a SiGe on insulator substrate. The fins 102 are formed by a lithographic patterning and etching process such as, for example, reactive ion etching (ME). In this example, the fins 102 are formed from a layer of SiGe, which was stressed during deposition or wafer fabrication process. Thus, the fins 102 remain stressed following the patterning along longitudinal axis of the fins 102 shown by the line 104. In the illustrated example, the fins 102 have a compressive strain, other examples may include fins with a tensile strain. Typically, a layer of SiGe is strained by epitaxially growing a layer of SiGe on a Si substrate, while a layer of Si may be strained by growing Si on a layer of SiGe.

Figure 2:
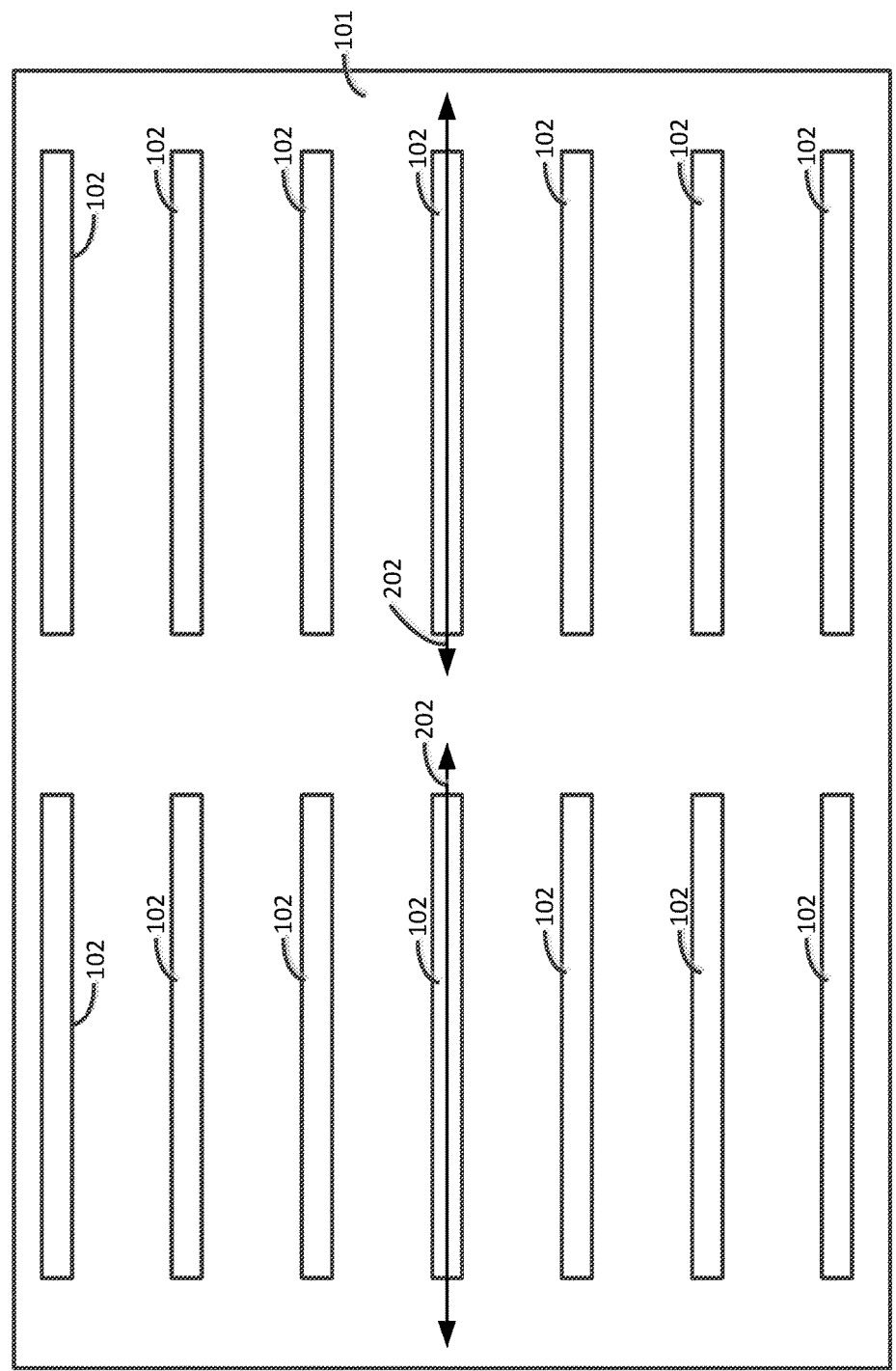
FIG. 2 illustrates the resultant structure following cutting the fins.

FIG. 2 illustrates the resultant structure following a subsequent patterning and etching process such as an ME process that cuts the fins 102 by removing a medial portion of the fins 102. The removal of the medial portion of the fins 102 results in pairs of fins 102 that have a relatively reduced stress along the line 202 relative to the stress of the fins 102 (of FIG. 1) prior to cutting the fins 102.

Figure 3:
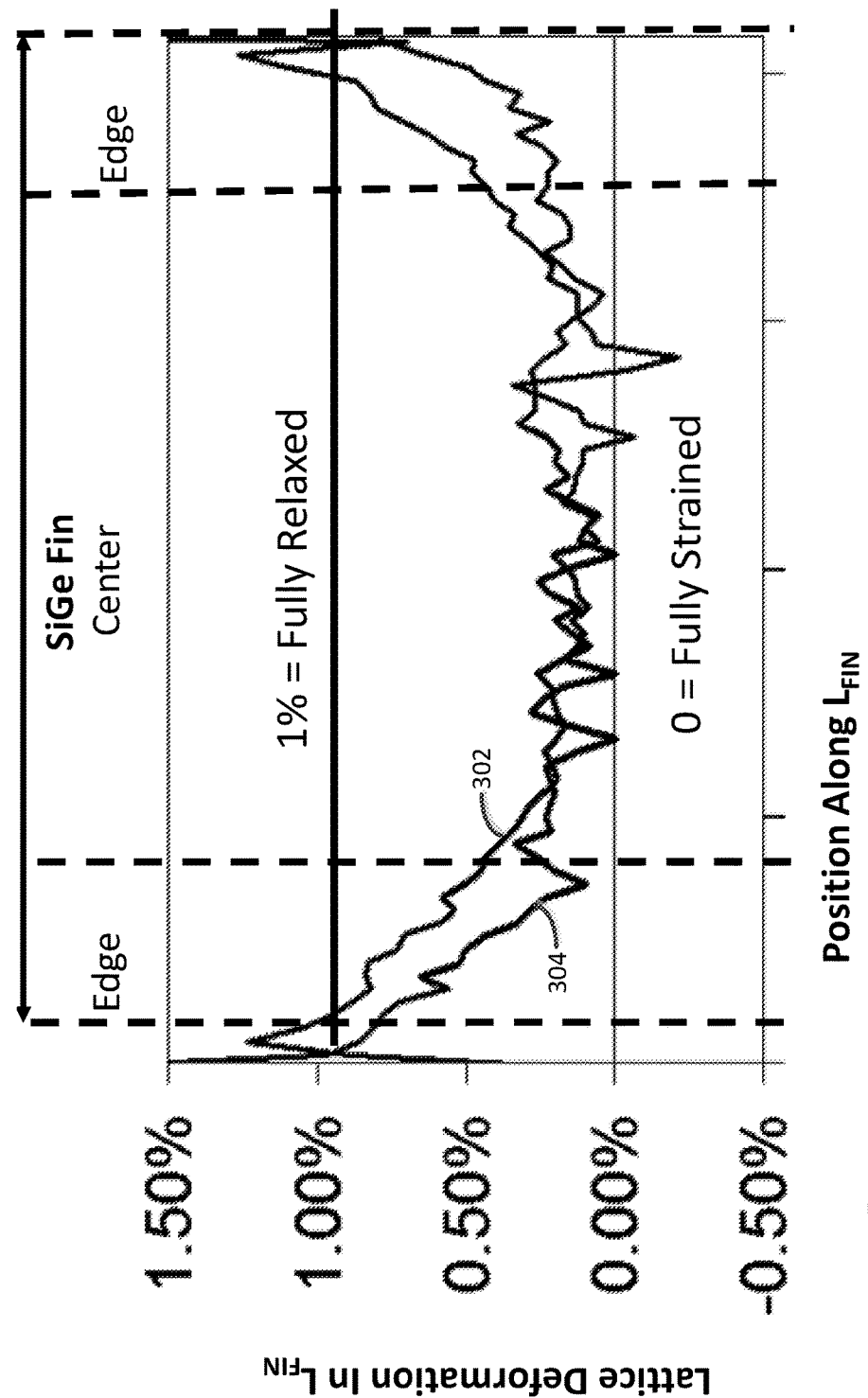
FIG. 3 illustrates a graph showing the stress of the cut fins of FIG. 2.

FIG. 3 illustrates a graph showing the stress (lattice deformation) of the cut fins 102 (of FIG. 2) along the longitudinal axis of the fins 102. In this regard, the distal ends and edges of the fins 102 are considerably less strained than the medial (center) portions of the fins 102. The reduced stress in the cut fins 102 is undesirable.

Figure 4:
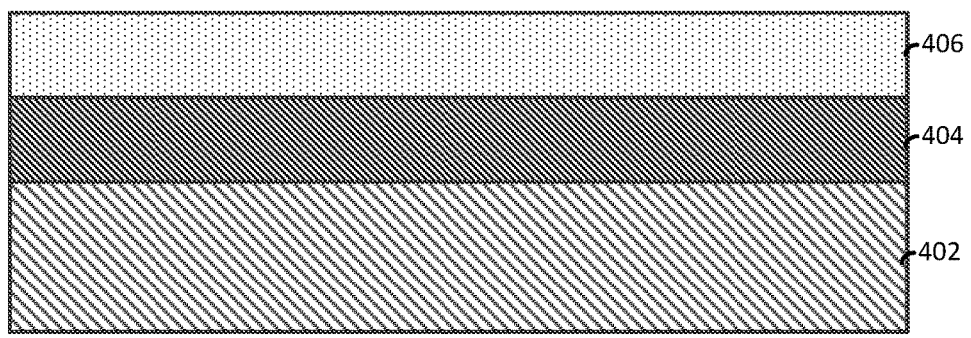
FIG. 4 illustrates a side cut-away view of a substrate.

FIGS. 4-18 illustrate an exemplary method of forming a finFET device having stressed fins. FIG. 4 illustrates a side cut-away view of a substrate 402 that may be formed from, for example, a silicon material. An insulator layer 404 is arranged on the substrate 402, where the insulator layer 404 may include, for example, an oxide material. A layer of semiconductor material 406 is arranged on the insulator layer 404. The semiconductor material may include, for example, a silicon or silicon germanium material. The illustrated exemplary embodiment shows a silicon on insulator (SOI) arrangement, however alternate exemplary embodiments may include a bulk silicon, a bulk SiGe arrangement or a SiGe on insulator arrangement.

Figure 5:
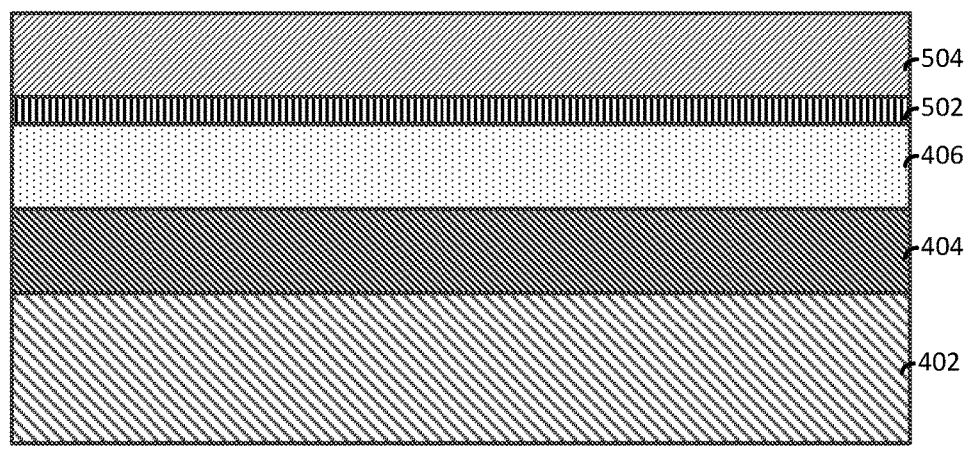
FIG. 5 illustrates the formation of an oxide layer.

FIG. 5 illustrates the formation of an oxide layer 502 over the semiconductor material 406. The oxide layer 502 may be formed by, for example, a growth process that forms an oxide material such as, for example silicon dioxide. A hardmask layer 504 is deposited over the oxide layer 502, where the hardmask layer 504 may include, for example a nitride material.

Figure 6:
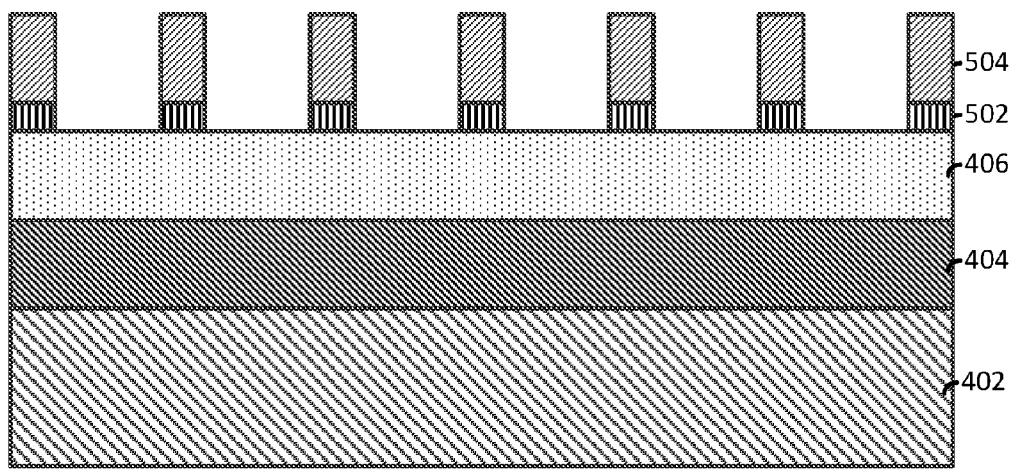
FIG. 6 illustrates the patterning of the hardmask layer and oxide layer.

FIG. 6 illustrates the patterning of the hardmask layer 504 and oxide layer 502 to expose portions of the semiconductor material 406. The patterning may be performed by, for example, a suitable anisotropic etching process.

Figure 7:
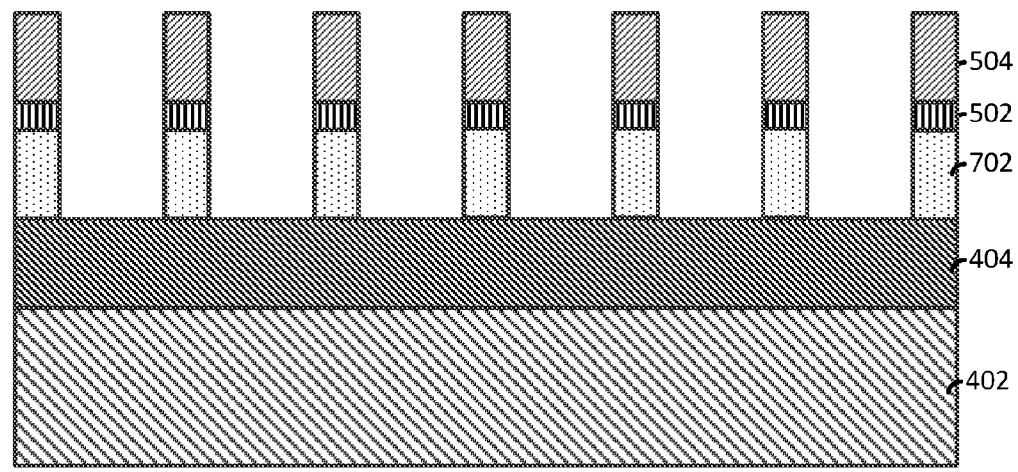
FIG. 7 illustrates the fabrication of fins.

FIG. 7 illustrates the fabrication of fins 702 with the patterned hardmask layer 504 and oxide layer 502 using an etching process such as, for example, a reactive ion etch (RIE) process. The etching process defines the fins 702 by removing exposed semiconductor material 406 (of FIG. 6) and exposing portions of the insulator layer 404.

Figure 8:
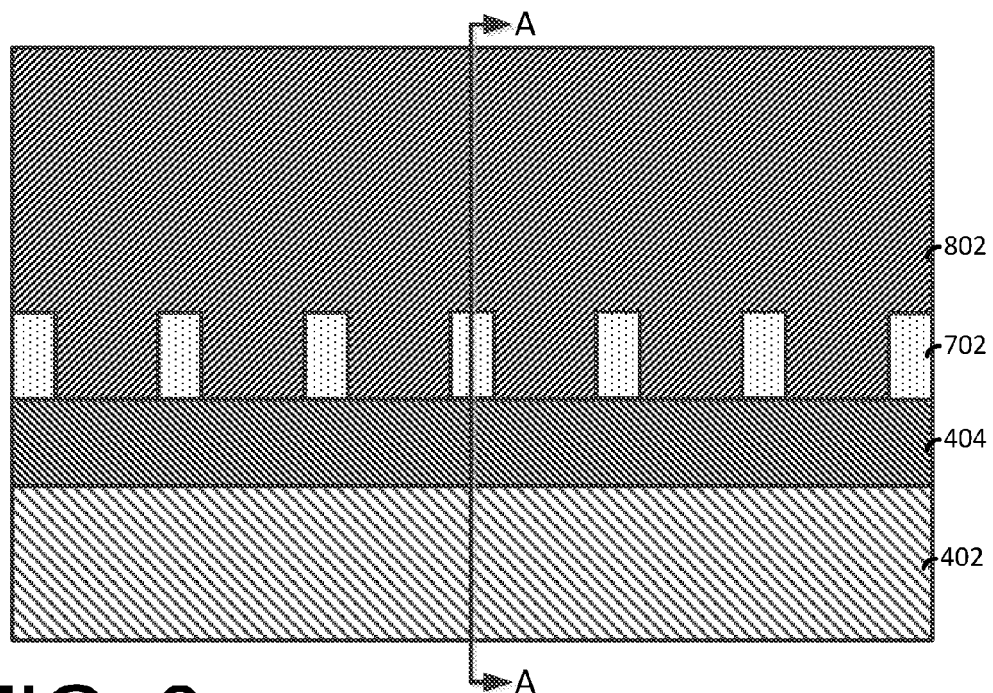
FIG. 8 illustrates the deposition of an amorphous silicon layer.
Figure 9:
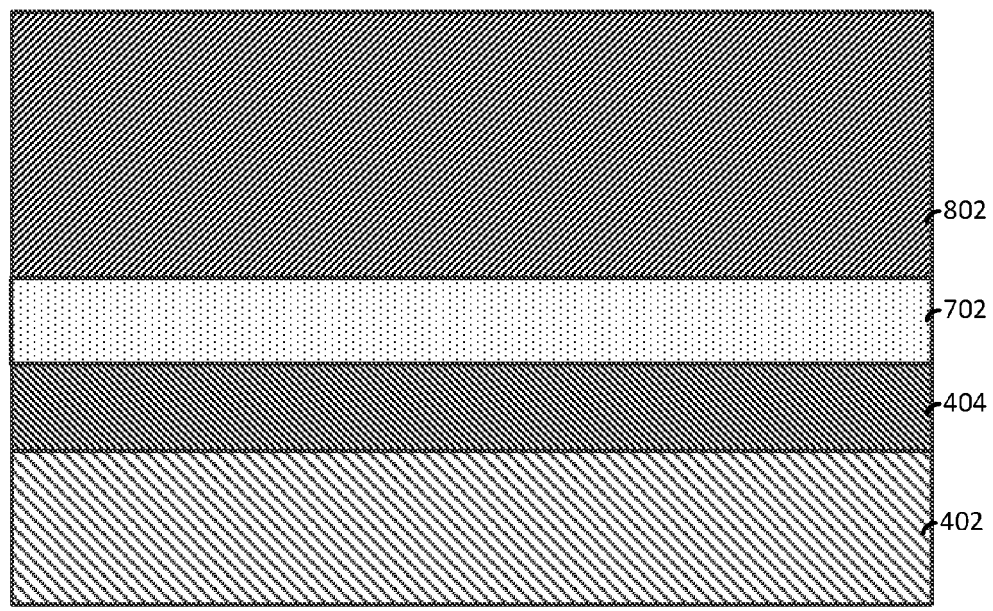
FIG. 9 illustrates a cut-away view along the line A-A of FIG. 8.

FIG. 8 illustrates the deposition of an amorphous silicon (α-Si) layer 802 over the fins 702 and exposed portions of the insulator layer 404. In the illustrated embodiment, the hardmask layer 504 and the oxide layer 502 have been removed prior to depositing the α-Si layer 802. Alternate exemplary methods may not remove the hardmask layer 504 prior to depositing the α-Si (polysilicon) layer 802. In an alternate embodiment, a layer of oxide material (not shown) may be deposited over the exposed portions of the fins 702 and insulator layer 404 prior to depositing the α-Si layer 802. FIG. 9 illustrates a cut-away view along the line A-A of FIG. 8. The use of α-Si for the α-Si layer 802 allows the α-Si layer 802 to be used in subsequent fabrication processes to pattern gate stacks as discussed below. However, alternate embodiments may use, for example, amorphous carbon (α-C) to form the layer 802.

Figure 10:
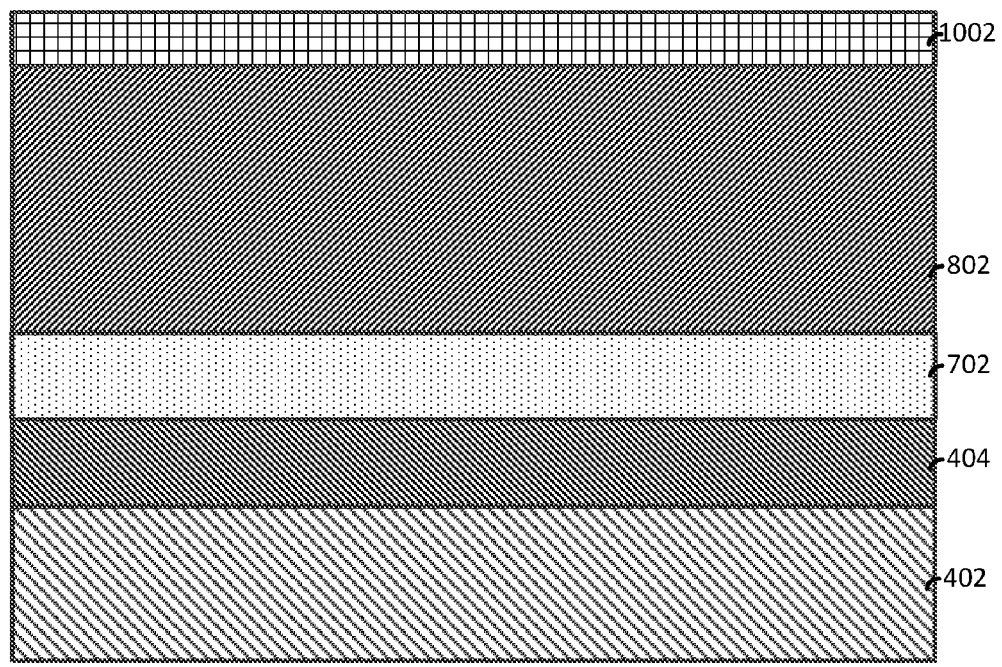
FIG. 10 illustrates the formation of a hardmask layer.

FIG. 10 illustrates the formation of a hardmask layer 1002 over the α-Si layer 802. The hardmask layer 1002 may include, for example, a silicon nitride material.

Figure 11:
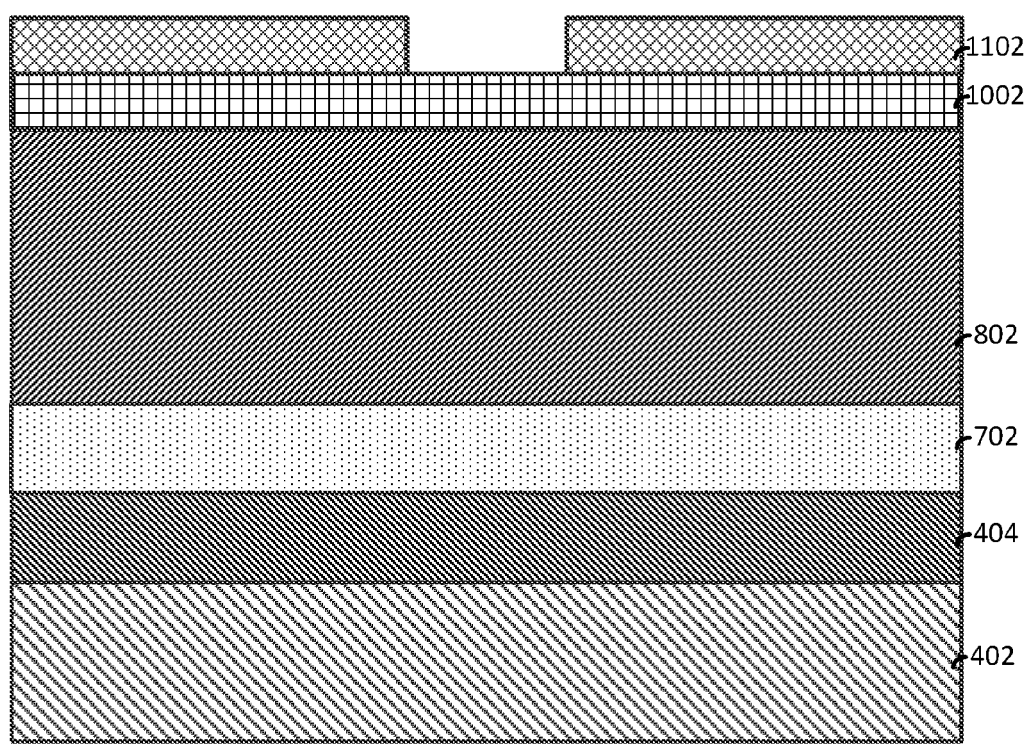
FIG. 11 illustrates the formation of a mask.

FIG. 11 illustrates the formation of a mask 1102 that is lithographically patterned over the hardmask layer 1002. The mask 1102 may be formed from, for example, an organic mask material.

Figure 12:
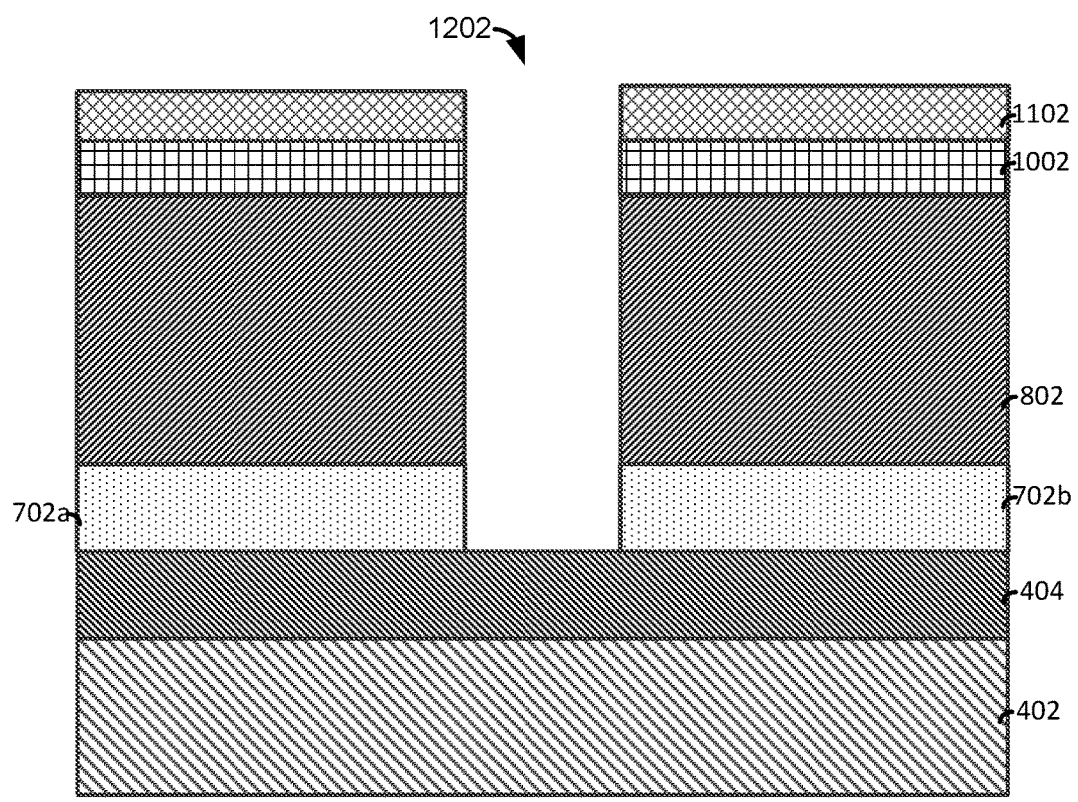
FIG. 12 illustrates the resultant structure following an etching process.

FIG. 12 illustrates the resultant structure following an etching process, such as, for example, a dry etching or RIE process that removes exposed portions of the hardmask 1002, exposed portions of the α-Si layer 802, and the fins 702. The etching process results in a cavity 1202. As discussed above with FIG. 2, when the fins 102 are etched or cut into segments 702a and 702b, the strain on the fins 102 is undesirably relaxed. In the illustrated exemplary method, the α-Si layer 802 and the hardmask 1002 secure the fins 702 to substantially maintain the stress in the fins 702 when the cavity 1202 is formed. Though the illustrated embodiment shows the fins 702 being cut into two segments, the fins 702 may be cut into any number of segments in alternate exemplary methods.

Figure 13:
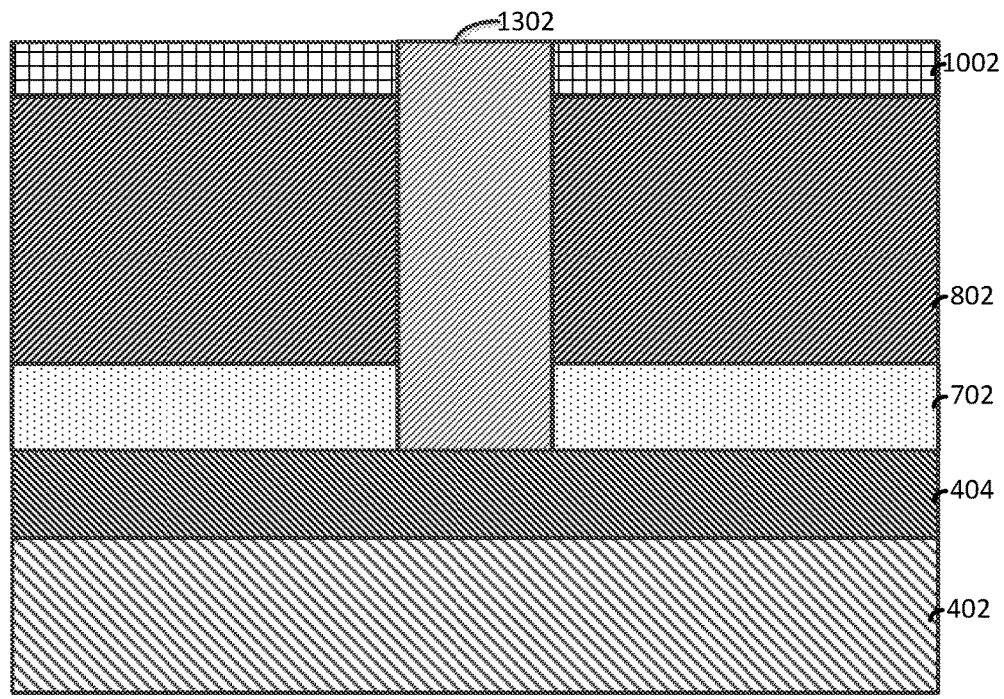
FIG. 13 illustrates the resultant structure following the deposition of an insulator material in the cavity.
Figure 14:
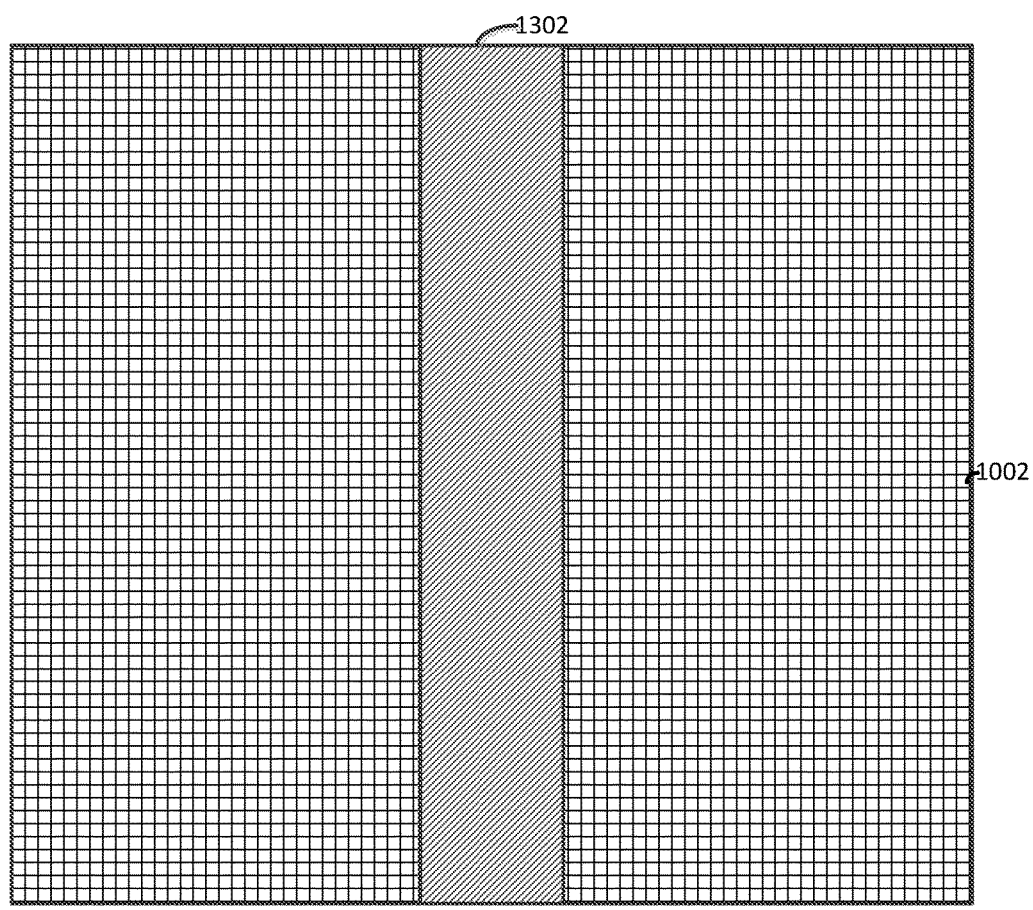
FIG. 14 illustrates a top view of the resultant structure of FIG. 13.

FIG. 13 illustrates the resultant structure following the deposition of an insulator material 1302 in the cavity 1202 (of FIG. 12) such as, for example an oxide or a nitride material. Depending on the design specifications for the device, the insulator material 1302 may include a compressive material, a tensile material, or a neutral material. For example, if a compressive strain is desired in the fins 702, a compressive insulating material may be deposited. A tensile material may be deposited if a tensile strain is desired. Likewise, a neutral material may also be used if desired. FIG. 14 illustrates a top view of the arrangement described in FIG. 13.

Figure 15:
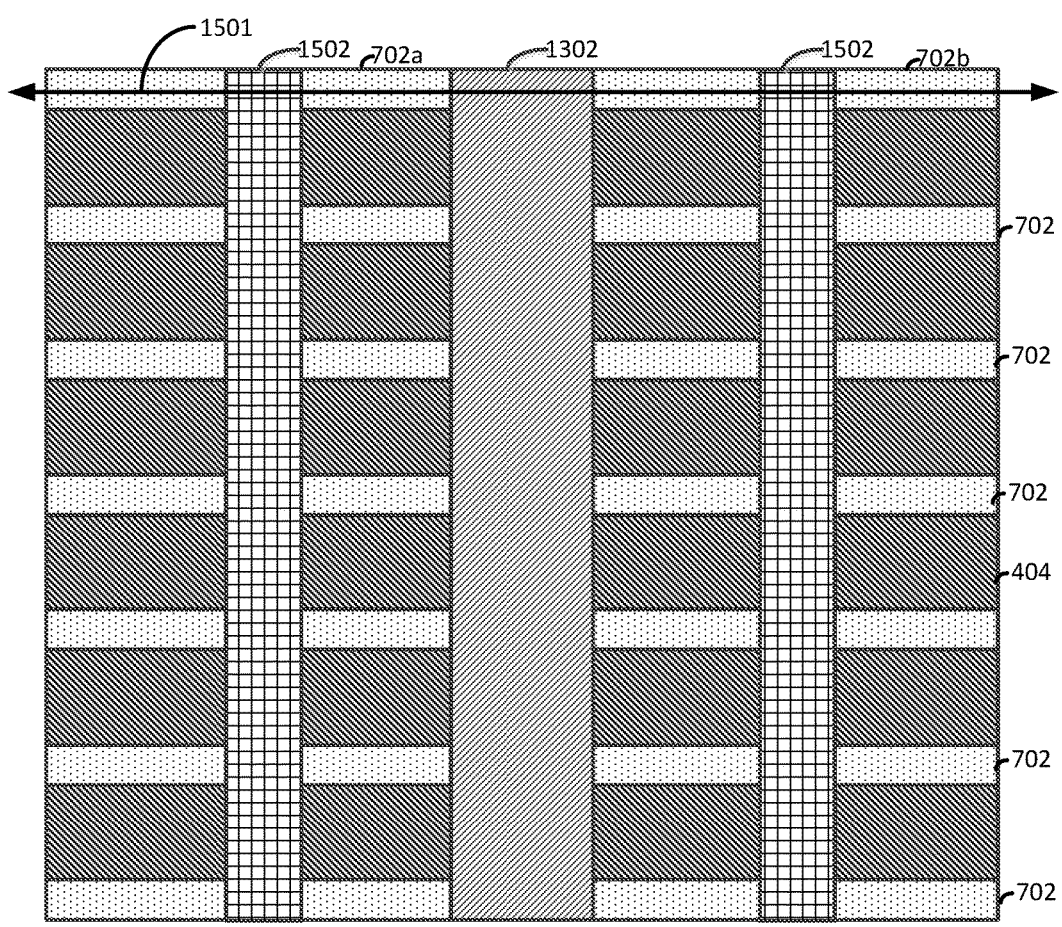
FIG. 15 illustrates a top view of the resultant structure following patterning and etching.

FIG. 15 illustrates a top view of the resultant structure following the patterning and etching of portions of the hardmask layer 1002 and the α-Si layer 802 to define dummy gate stacks 1502. The dummy gate stacks 1502 define channel regions of the fins 702. The dummy gate stacks 1502 may be formed using a suitable lithographic patterning and etching process. The fins 702a and 702b are arranged along a common longitudinal axis shown by the arrow 1501. The dummy gate patterning may be performed using the hardmask layer 1002 as described above, or in alternate exemplary embodiments, the hardmask layer 1002 may be replaced with another hardmask layer that is suitable for patterning.

Figure 16:
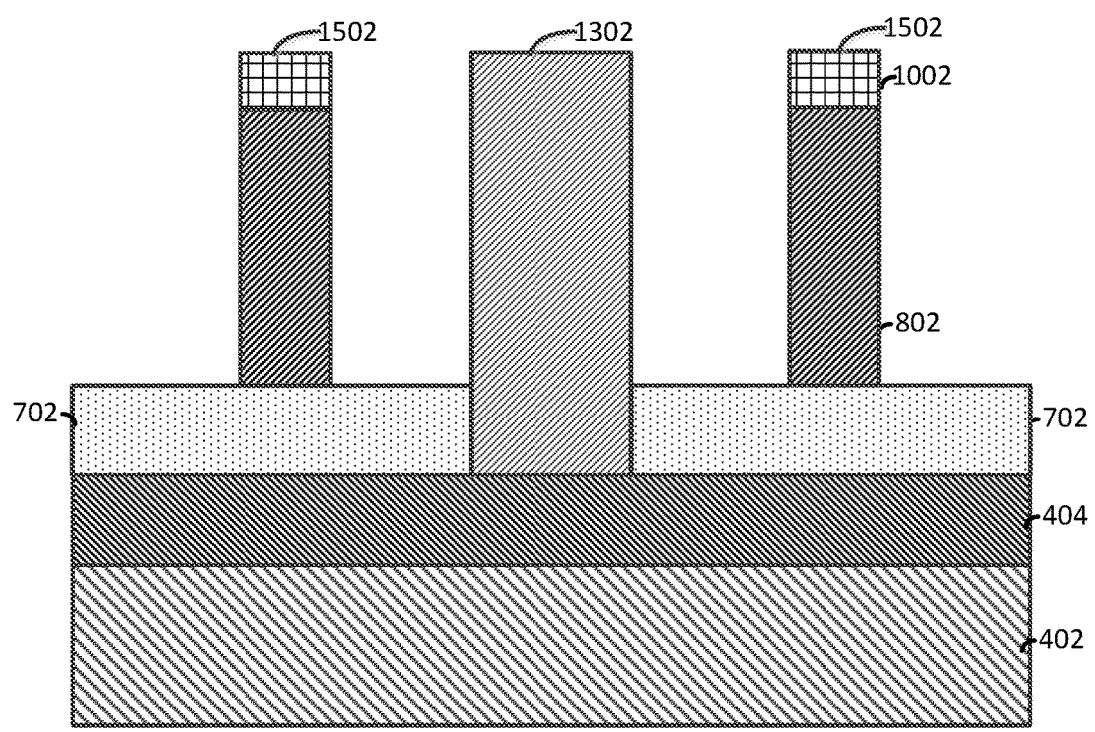
FIG. 16 illustrates a side cut-away view of the dummy gate stacks.

FIG. 16 illustrates a side cut-away view of the dummy gate stacks 1502 on the fins 702 and the insulator material 1302 arranged between the fins 702. The insulator material 1302 maintains the strain on the fins 702 by filling the cut void between the fins 702 once portions of the α-Si layer 802 and the hardmask layer 1002 are removed when the dummy gate stacks 1502 are formed.

Figure 17:
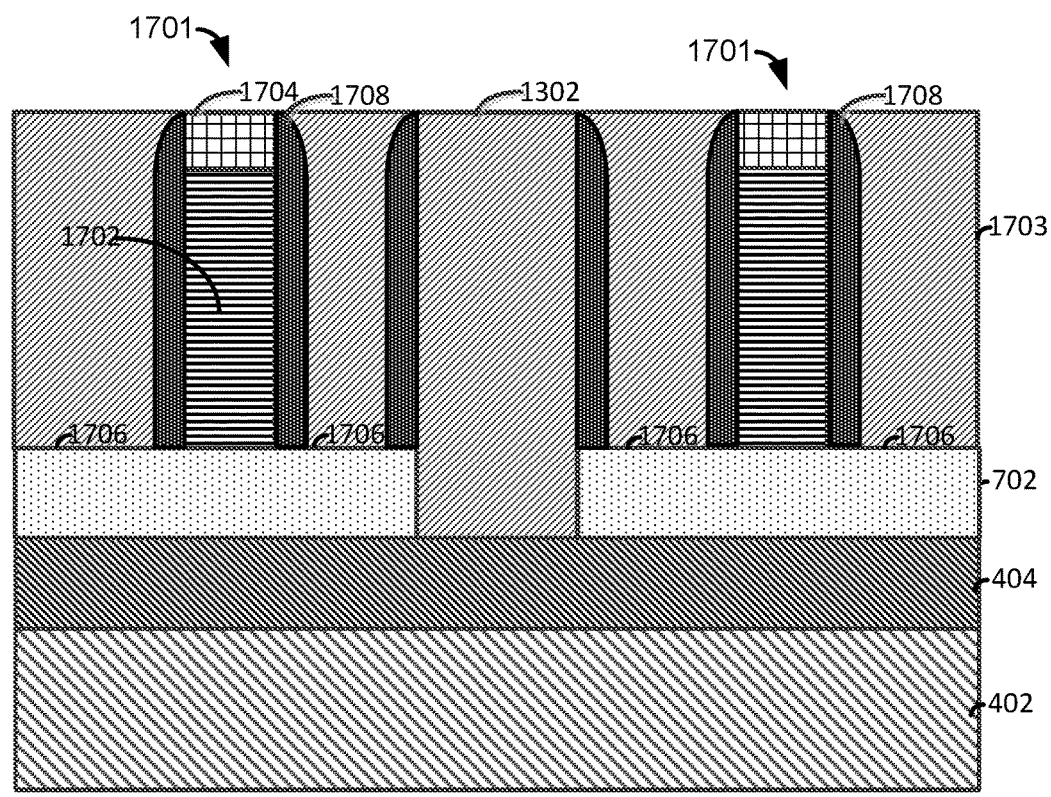
FIG. 17 illustrates the resultant finFET devices following the formation of gates.

FIG. 17 illustrates the resultant finFET devices following the formation of gates 1701. The gates 1701 of the FET devices may be formed following the formation of spacers 1708 that formed adjacent to the dummy gate stacks 1502 (of FIG. 16). Active regions 1706 on the fins 702 are formed by, for example, implanting dopants in the fins 702 and annealing the fins, or epitaxially growing a semiconductor material on the fins, which may be in-situ doped. A layer of insulator material 1703 such as, for example, an oxide material is formed over exposed portions of the insulator layer 404, the fins 702 and adjacent to the gate stacks 1701. The dummy gate stacks 1502 are removed and replaced by the gate stacks 1701. In the illustrated embodiment, the gate stacks 1702 include a dielectric layer and a gate metal layer 1702 and a cap layer 1704.

Figure 18:
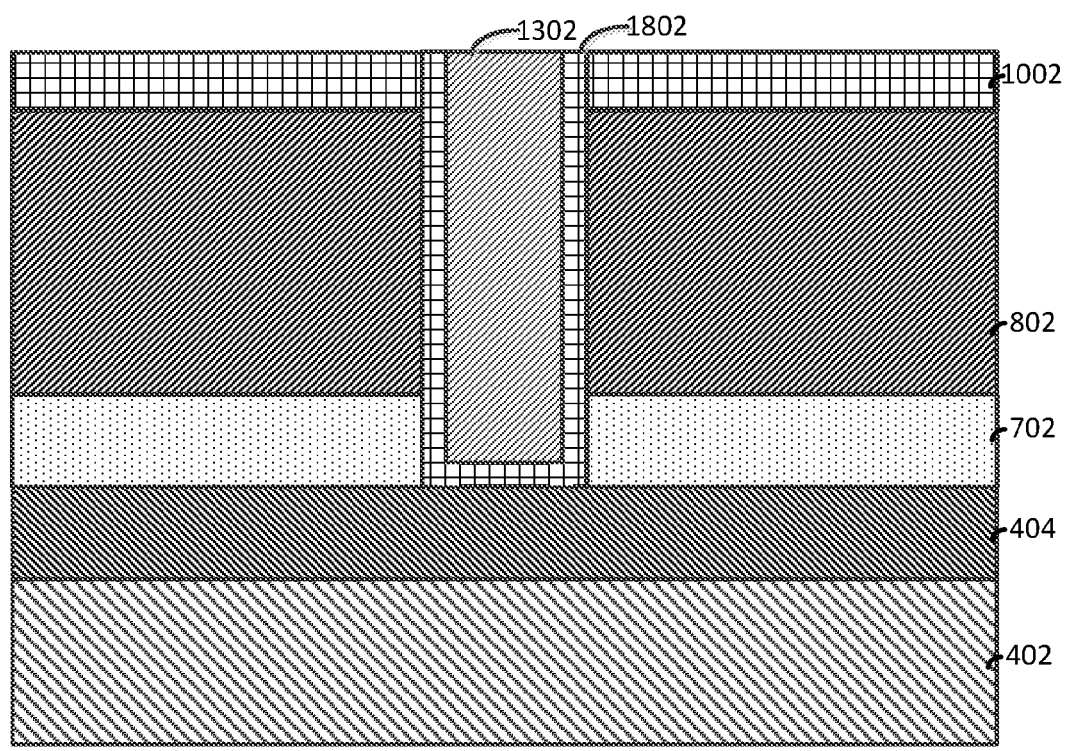
FIG. 18 illustrates an alternate exemplary method and structure that may be performed after the cavity is formed.

FIG. 18 illustrates an alternate exemplary method and structure that may be performed after the cavity 1202 is formed in FIG. 12. In FIG. 18, a layer of nitride material 1802 has been deposited in the cavity 1202 (of FIG. 12) prior to the deposition of the insulator material 1302. Once the insulator material 1302 is deposited over the nitride material 1802, similar fabrication methods as described above in FIGS. 14-17 may be performed to fabricate the devices.

Figure 19:
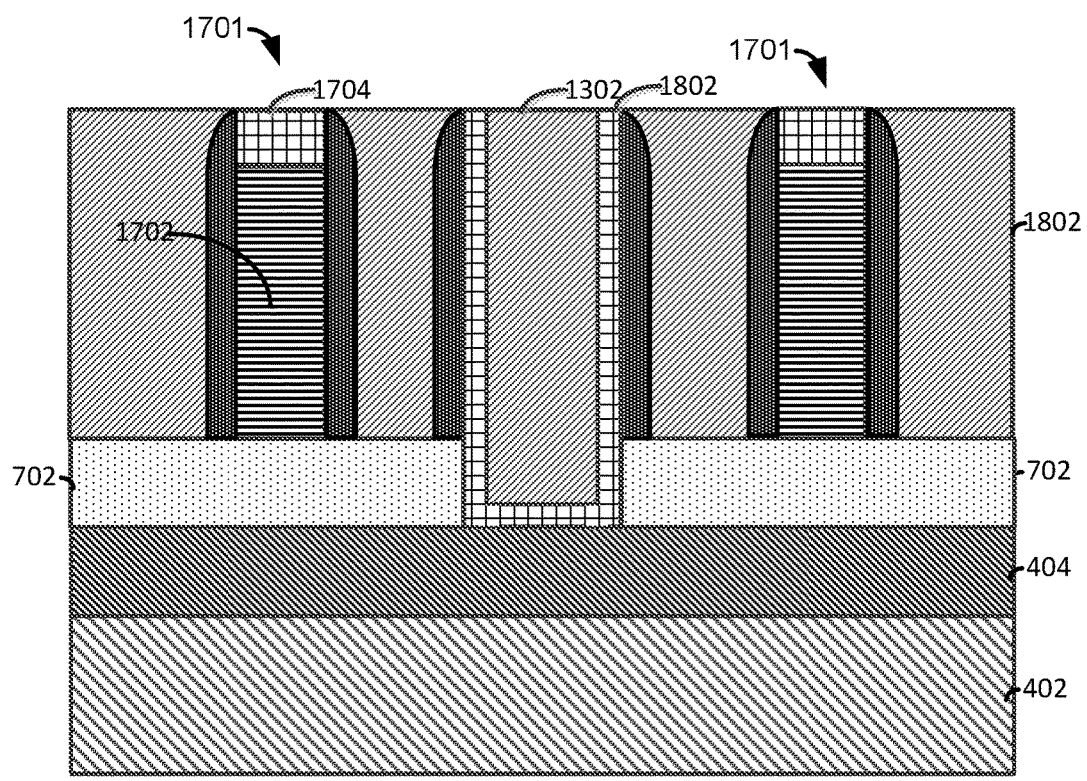
FIG. 19 illustrates the resultant finFET devices.

FIG. 19 illustrates the resultant finFET devices that are similar to the structure described above in FIG. 17. However, the nitride layer 1802 is arranged in contact with the fins 702 and the insulator material 1302.

Figure 20:
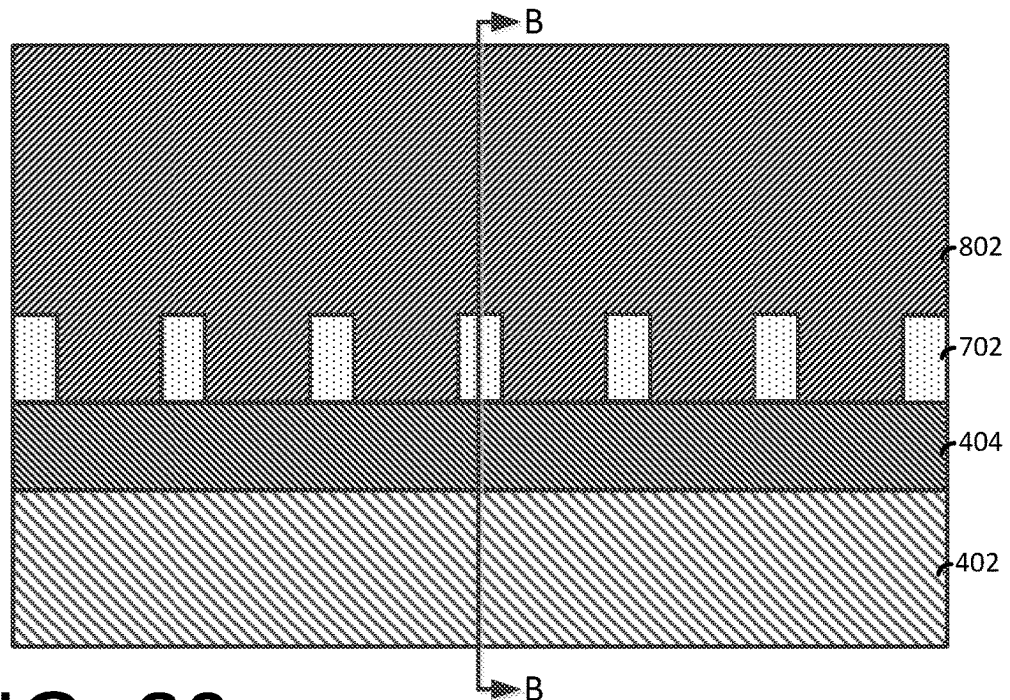
FIG. 20 includes a substrate, an insulator layer arranged on the substrate, and fins.
Figure 21:
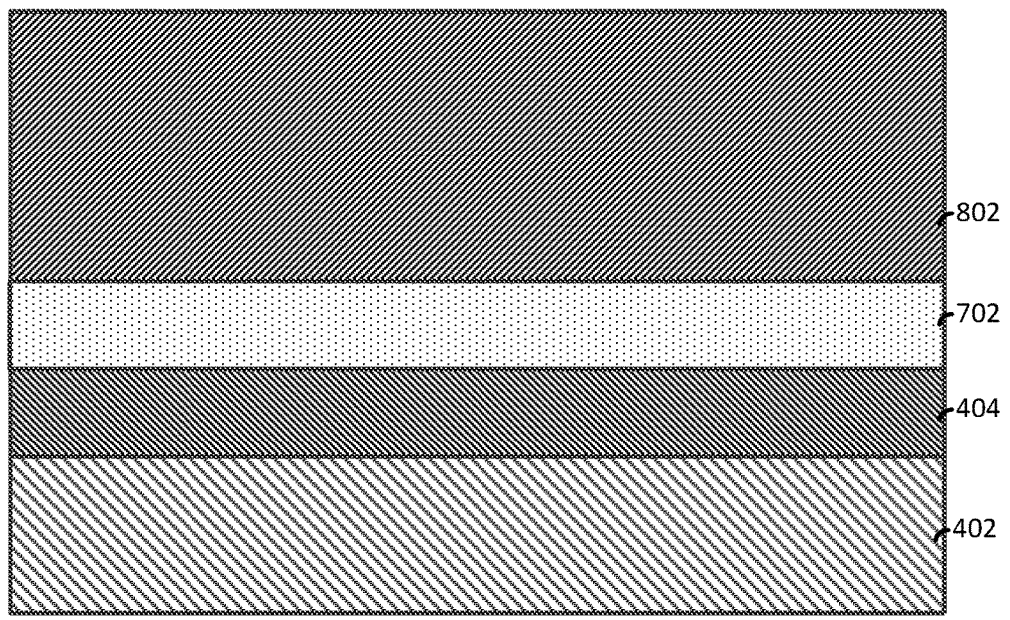
FIG. 21 illustrates a side cut-away view along the line B-B of FIG. 20.

FIGS. 20-28 illustrate an alternate exemplary method for forming a stressed finFET device. FIG. 20 is similar to FIG. 8 described above and includes a substrate 402, an insulator layer 404 arranged on the substrate 402, fins 702 patterned on the insulator layer 404 and an α-Si layer deposited over the fins 702 and exposed portions of the insulator layer 404. FIG. 21 illustrates a side cut-away view along the line B-B of FIG. 20.

Figure 22:
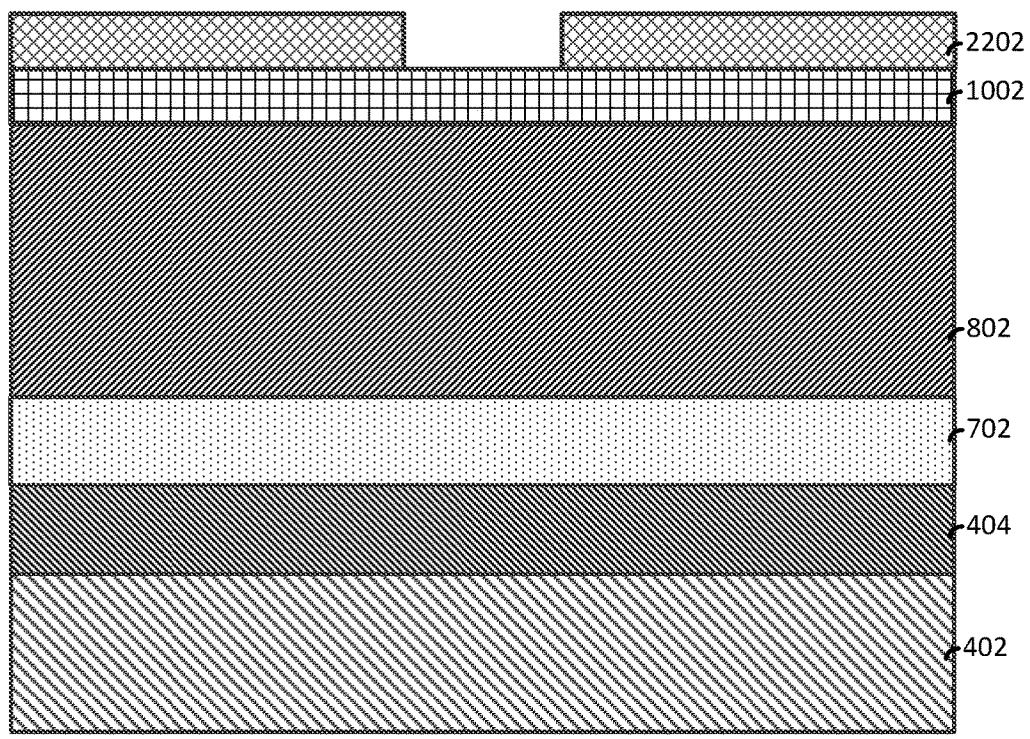
FIG. 22 illustrates the formation of hardmask layer and a masking layer.

FIG. 22 illustrates the formation of hardmask layer 1002 and a masking layer 2202 on the hardmask layer 1002. The masking layer 2202 may be patterned using, for example, a lithographic process.

Figure 23:
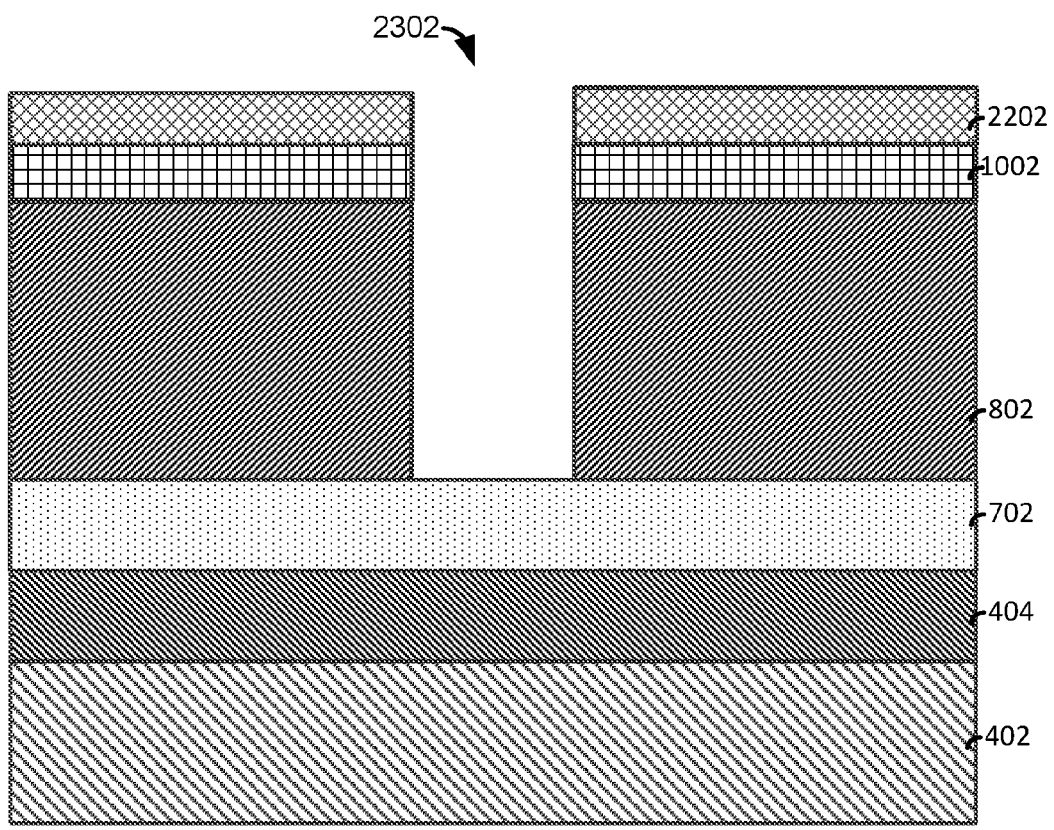
FIG. 23 illustrates the formation of a cavity.

FIG. 23 illustrates the formation of a cavity 2302. The cavity 2302 is formed by, for example, a dry etching process that removes exposed portions of the hardmask 1002 and the α-Si layer 802 to expose portions of the fins 702.

Figure 24:
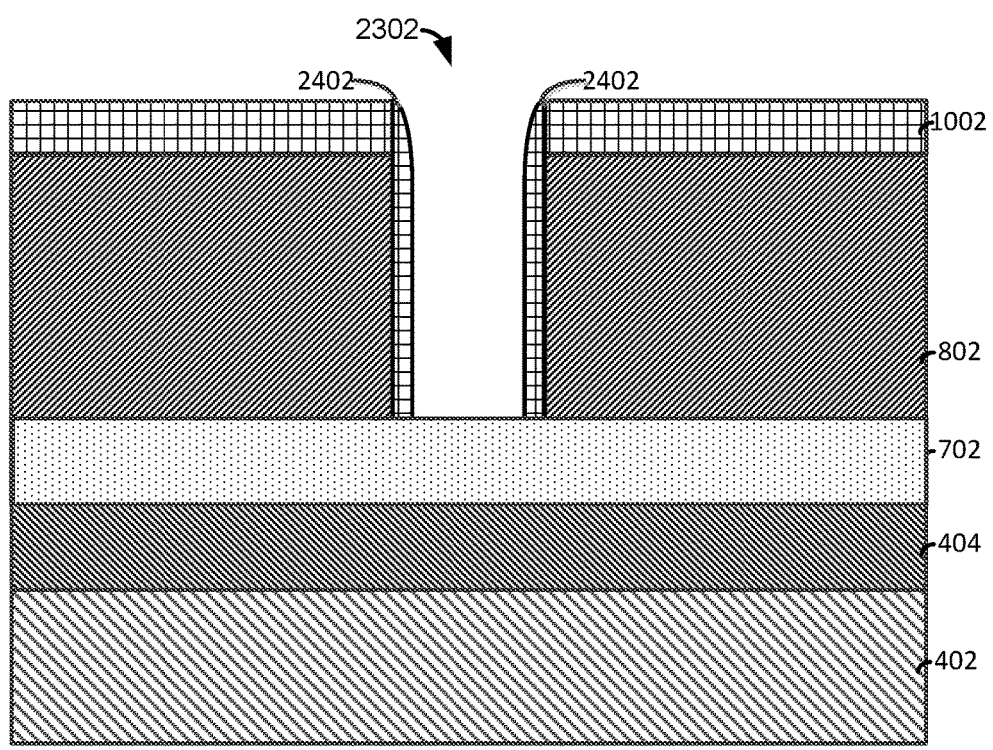
FIG. 24 illustrates the formation of spacers.

FIG. 24 illustrates the formation of spacers 2402 on the fins 702 and along sidewalls of the cavity 2302. The spacers 2402 may be formed by, for example, depositing a nitride material in the cavity 2402 and performing a RIE process that exposes portions of the fins 702.

Figure 25:
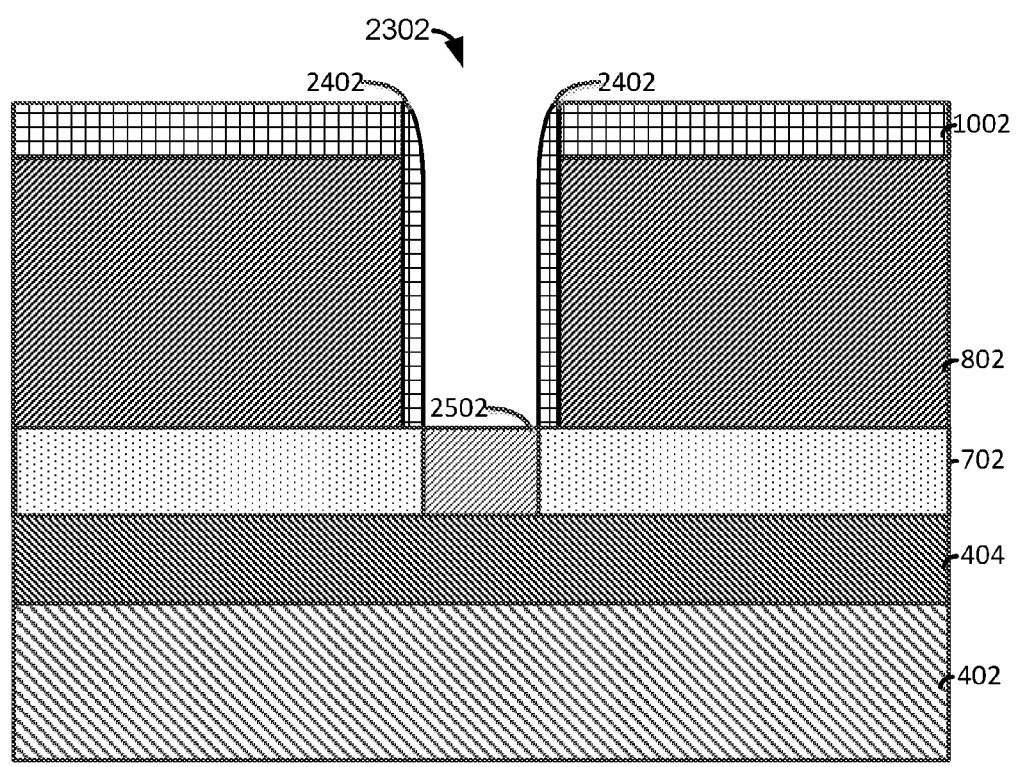
FIG. 25 illustrates the formation of an oxide region.

FIG. 25 illustrates the formation of an oxide region 2502 in exposed portions of the fins 702. The oxide region 2502 may be formed by, for example, a low temperature oxidation process. In some embodiments, the spacers 2402 may be removed, and the oxide region 2502 may be treated with plasma or a nitrogen implant to increase the robustness of the oxide region 2502 in subsequent processes. The oxide region 2502 electrically separates the fin 702 into two segments, without physically cutting the fin, while maintaining the strain on the fin 702.

Figure 26:
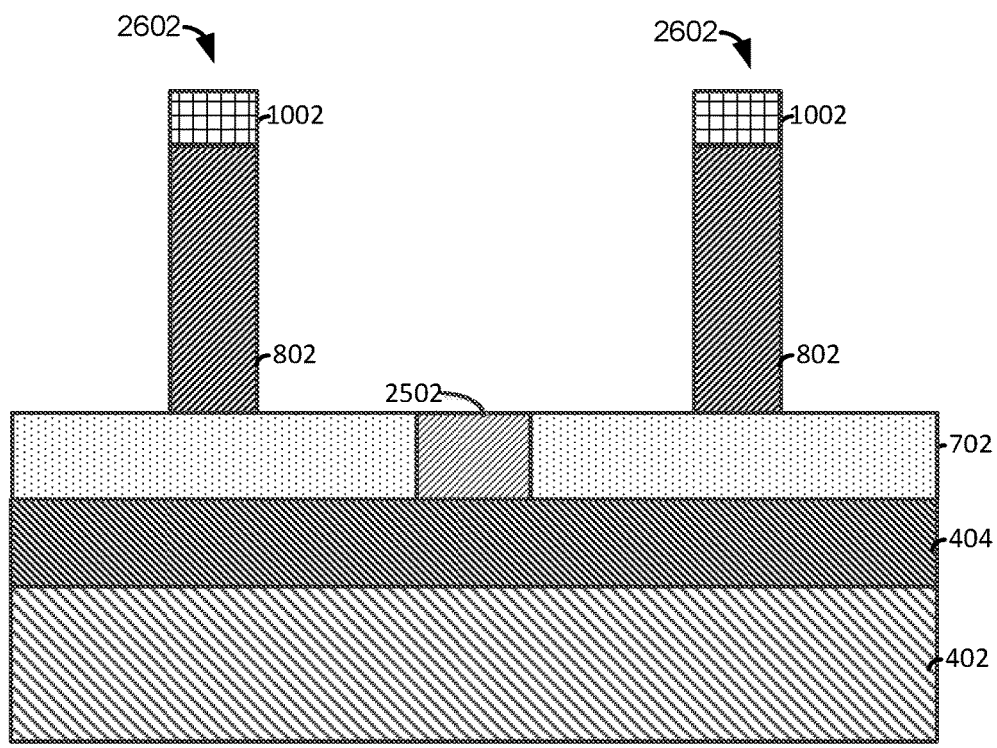
FIG. 26 illustrates the formation of dummy gate stacks.

FIG. 26 illustrates the formation of dummy gate stacks 2602 following a photolithographic etching process that removes exposed portions of the hardmask layer 1002 and the α-Si layer 802 to define channel regions on the fins 802.

Figure 27:
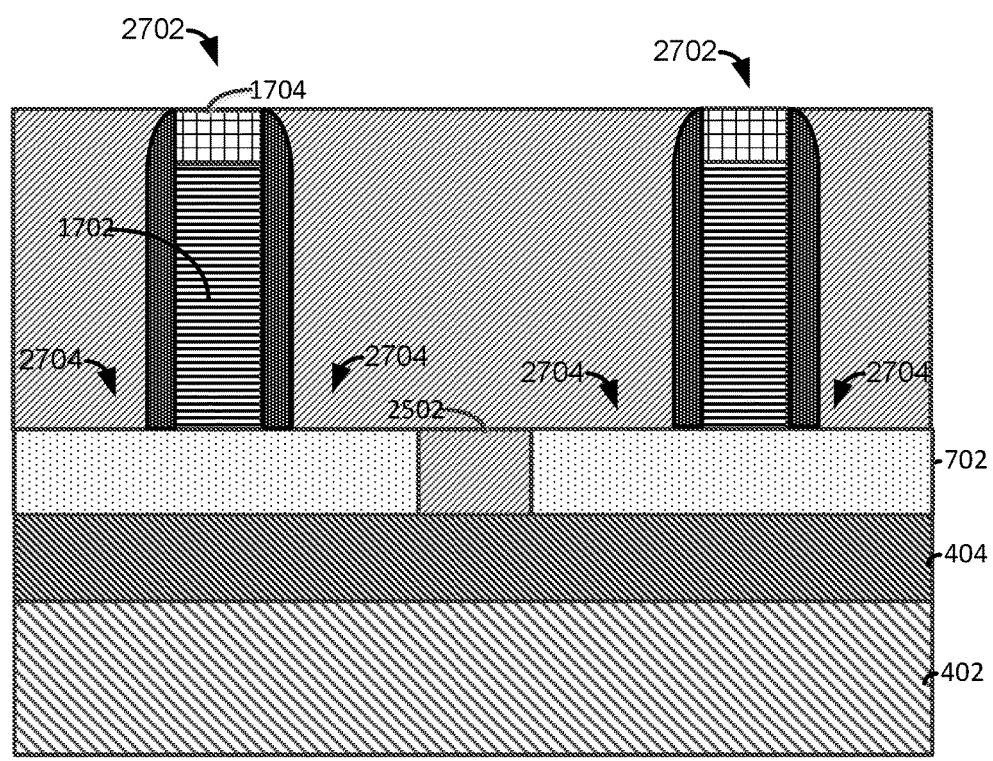
FIG. 27 illustrates the resultant finFET devices following the formation of active regions.

FIG. 27 illustrates the resultant finFET devices following the formation of active regions (source and drain) 2704 in the fins 702. Replacement gates 2702 are formed following the removal of the dummy gate stacks 2602 (of FIG. 26). The oxide region 2502 electrically isolates the fin 702 into effectively two fins while preserving the strain in the fins 702.

Figure 28:
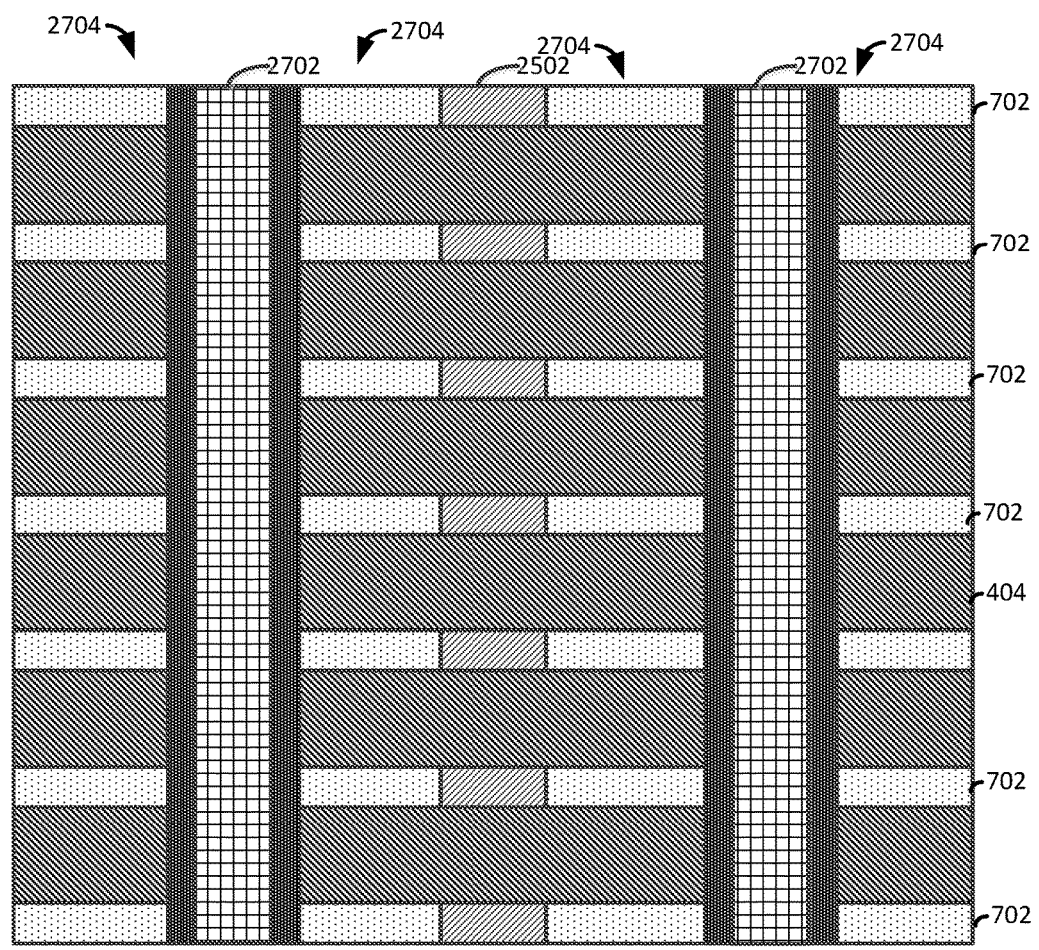
FIG. 28 illustrates a top view of the finFET devices.

FIG. 28 illustrates a top view of the finFET devices. The active regions 2704 are electrically isolated by the oxide region 2502.

Figure 29:
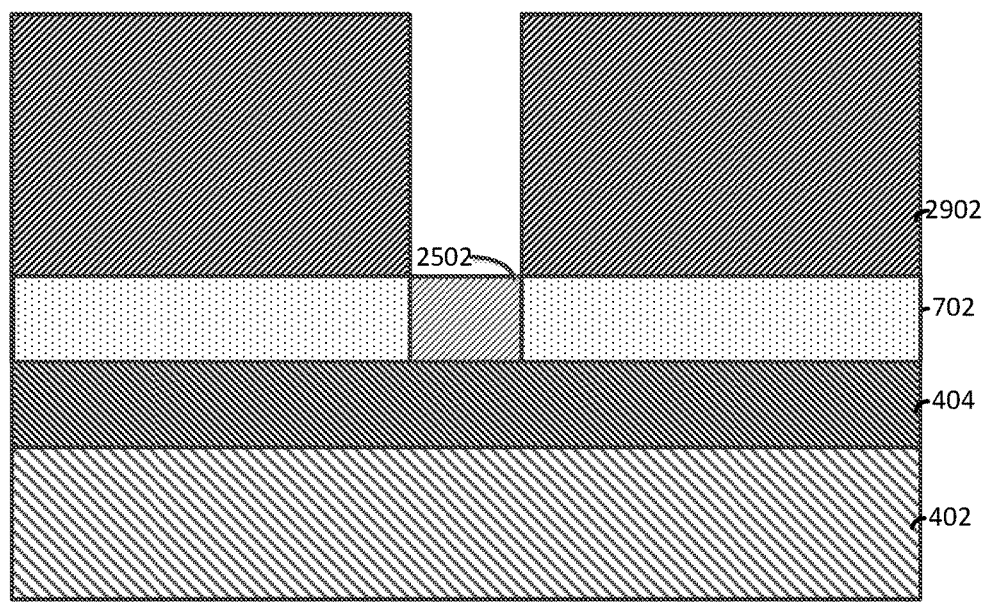
FIG. 29 illustrates an alternate exemplary method for forming fins for finFET devices.

FIG. 29 illustrates an alternate exemplary method for forming fins for a finFET device. In the illustrated embodiment, the fins 702 have been patterning using similar methods as described above. Following the formation of the fins 702, a masking layer 2902 is patterned over the fins and the insulator layer 404. The masking layer may include, for example an organic masking material. An oxidation process similar to the process described above in FIG. 25 is performed that forms an oxide region 2502 in the fin 702. The oxide region 2502 electrically isolates the fin 702 into two segments. Following the formation of the oxide region 2502, the masking layer 2902 may be removed. Subsequently, finFET devices that include active regions and gate stacks may be fabricated using methods similar to the methods described above.

The methods and devices described above include finFET devices having fins that remain stressed after electrically or physically dividing the fins.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field effect transistor device comprising:
   a fin having a first semiconductor segment, a second semiconductor segment and an insulator material region disposed between and filling an entirety of a cut void between the first semiconductor segment and the second semiconductor segment, the first semiconductor segment and the second semiconductor segment not being in direct physical contact; and
   a first gate stack arranged over the first semiconductor segment, the first gate stack not being over the second semiconductor segment,
   wherein the first semiconductor segment and the second semiconductor segment are on an insulator layer and the insulator material region directly physically contacts only the insulator layer, the first semiconductor segment, and the first semiconductor segment.

2. The device of claim 1, further comprising a second gate stack arranged over the second semiconductor segment.

3. The device of claim 1, wherein the first semiconductor segment includes a silicon germanium material.

4. The device of claim 1, wherein the insulator material region includes an oxide material.

5. The device of claim 1, wherein the insulator material region includes a nitride material.

6. The device of claim 1, wherein the insulator material region is operative to electrically isolate the first semiconductor segment from the second semiconductor segment.

7. The device of claim 1, wherein the first gate stack is not over the insulator material region.

8. The device of claim 1, wherein:
   the device further comprises an insulator layer on a substrate;
   the first semiconductor segment is on the insulator layer;
   the second semiconductor segment is on the insulator layer;
   the insulator material region directly physically contacts the insulator layer; and
   the insulator layer is between the insulator material region and the substrate.

9. The device of claim 1, wherein:
   the first semiconductor segment is on a substrate;
   the second semiconductor segment is on the substrate; and
   the insulator material region does not directly physically contact the substrate.

10. The device of claim 9, wherein the first semiconductor segment and the second semiconductor segment are on an insulator layer and the insulator material region directly physically contacts the insulator layer.

11. A field effect transistor device comprising:
    a fin having a first semiconductor segment, a second semiconductor segment and an insulator material region disposed between and filling an entirety of a cut void between the first semiconductor segment and the second semiconductor segment, the first semiconductor segment and the second semiconductor segment not being in direct physical contact; and
    a first gate stack arranged over the first semiconductor segment, the first gate stack not being over the insulator material region,
    wherein the first semiconductor segment and the second semiconductor segment are on an insulator layer and the insulator material region directly physically contacts only the insulator layer, the first semiconductor segment, and the first semiconductor segment.

12. The device of claim 11, wherein:
    the device further comprises an insulator layer on a substrate;
    the first semiconductor segment is on the insulator layer;
    the second semiconductor segment is on the insulator layer;
    the insulator material region directly physically contacts the insulator layer; and
    the insulator layer is between the insulator material region and the substrate.

13. The device of claim 11, wherein:
    the first semiconductor segment is on a substrate;
    the second semiconductor segment is on the substrate; and
    the insulator material region does not directly physically contact the substrate.

14. The device of claim 13, wherein the first semiconductor segment and the second semiconductor segment are on an insulator layer and the insulator material region directly physically contacts the insulator layer.

* * * * *